United States Patent
Shiraishi

(10) Patent No.: US 7,633,150 B2
(45) Date of Patent: Dec. 15, 2009

(54) SEMICONDUCTOR DEVICE AND METHOD FOR MANUFACTURING SEMICONDUCTOR DEVICE

(75) Inventor: Akinori Shiraishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 331 days.

(21) Appl. No.: 11/483,911

(22) Filed: Jul. 10, 2006

(65) Prior Publication Data

US 2007/0013082 A1 Jan. 18, 2007

(30) Foreign Application Priority Data

Jul. 13, 2005 (JP) ............... 2005-204795

(51) Int. Cl.
*H01L 23/12* (2006.01)
(52) U.S. Cl. ................. 257/704; 257/710; 257/E23.18; 257/E23.181; 257/E23.188; 257/E23.192; 257/E23.193
(58) Field of Classification Search ................. 257/704, 257/710, E23.128, E23.18–E23.193, E21.5, 257/E21.501
See application file for complete search history.

(56) References Cited

U.S. PATENT DOCUMENTS

| | | | |
|---|---|---|---|
| 6,297,072 B1 | 10/2001 | Tilmans et al. | |
| 6,555,901 B1 | 4/2003 | Yoshihara et al. | |
| 7,067,355 B2 * | 6/2006 | Haluzak et al. | ............. 438/116 |
| 7,180,173 B2 * | 2/2007 | Kuo et al. | ................... 257/706 |
| 2002/0113296 A1 | 8/2002 | Cho et al. | |
| 2004/0087043 A1 | 5/2004 | Lee et al. | |
| 2005/0012169 A1 | 1/2005 | Ikeda et al. | |
| 2006/0105493 A1 * | 5/2006 | Hunze et al. | .................. 438/99 |

FOREIGN PATENT DOCUMENTS

| | | | | |
|---|---|---|---|---|
| EP | 1 405 821 A2 | 4/2004 | | |
| EP | 1 544 164 A2 | 6/2005 | | |
| JP | 63-261860 | * 10/1988 | ................. | 257/704 |
| JP | 5-13608 | * 1/1993 | ................. | 257/704 |
| JP | 08-316496 | 11/1996 | | |
| JP | 2000-141300 | 5/2000 | | |
| JP | 2002-246489 | 8/2002 | | |
| JP | 2005-019966 | 1/2005 | | |

OTHER PUBLICATIONS

Hsueh-An Yang, et al; "Localized induction heating solder bonding for wafer level MEMS packaging", Institute of Physics Publishing, Journal of Micromechanics and Microengineering, 15 (2005), pp. 394-399.

(Continued)

*Primary Examiner*—Jasmine J Clark
(74) *Attorney, Agent, or Firm*—Ladas & Parry LLP

(57) ABSTRACT

A disclosed semiconductor device comprises a substrate, an element on the substrate and a sealing structure for sealing the element. The sealing structure has a structure such that a partition wall made of a metallic material formed on the substrate by a plating method so as to surround the element and a cap portion disposed on the partition wall are bonded via a bonding layer made of an inorganic material.

6 Claims, 10 Drawing Sheets

OTHER PUBLICATIONS

Warren Welch III, et al; "Transient Liquid Phase (TLP) Bonding For Microsystem Packaging Applications", The 13$^{th}$ International Conference on Solid-State Sensors, Actuators and Microsystems, Seoul, Korea, Jun. 5-9, 2005, pp. 1350-1353.

Wei Ma, et al; "Fabrication and packaging of inertia micro-switch using low-temperature photo-resist molded metal-electroplating technology", Sensors and Actuators A 111 (2004), pp. 63-70.

European Search Report: dated Nov. 19, 2008; Application No./Patent No. 062353441.7-2203 / 1743868.

* cited by examiner

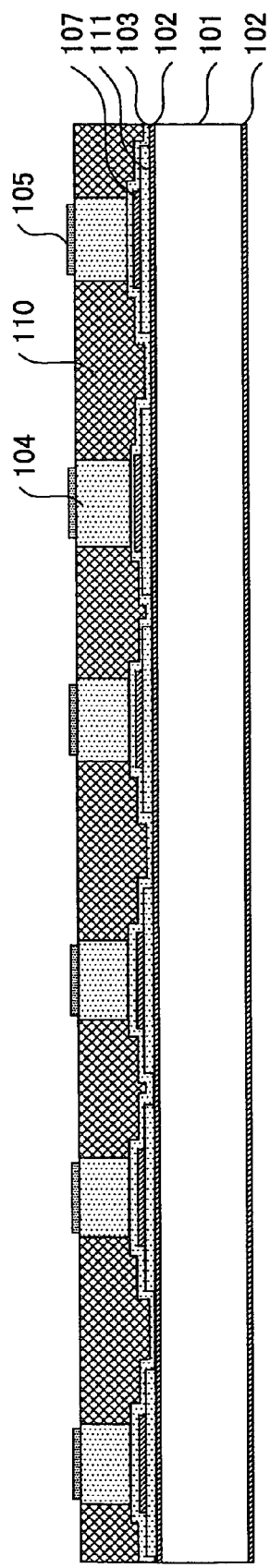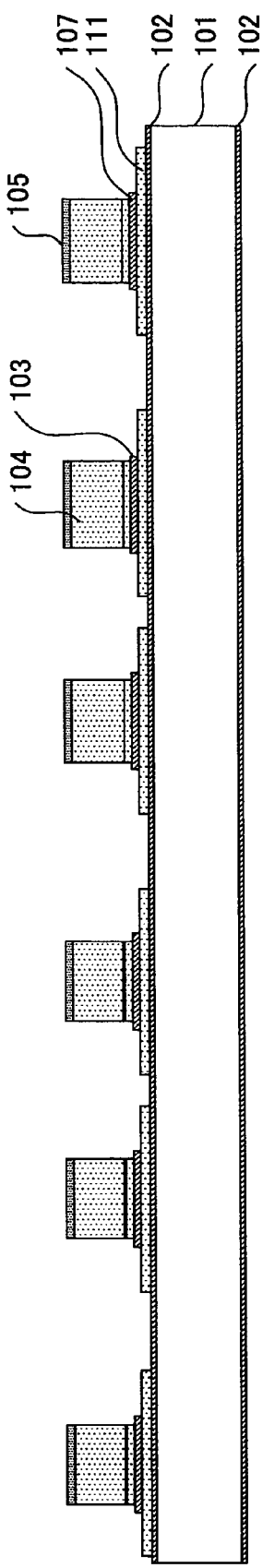

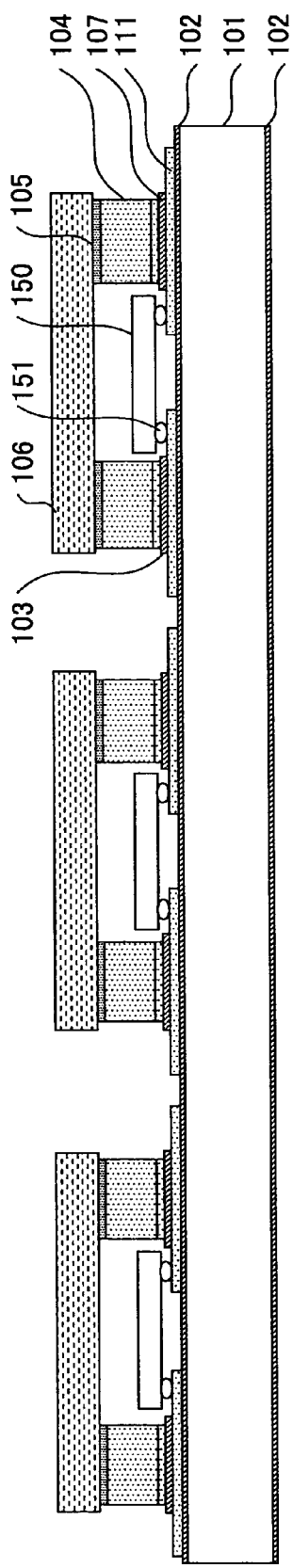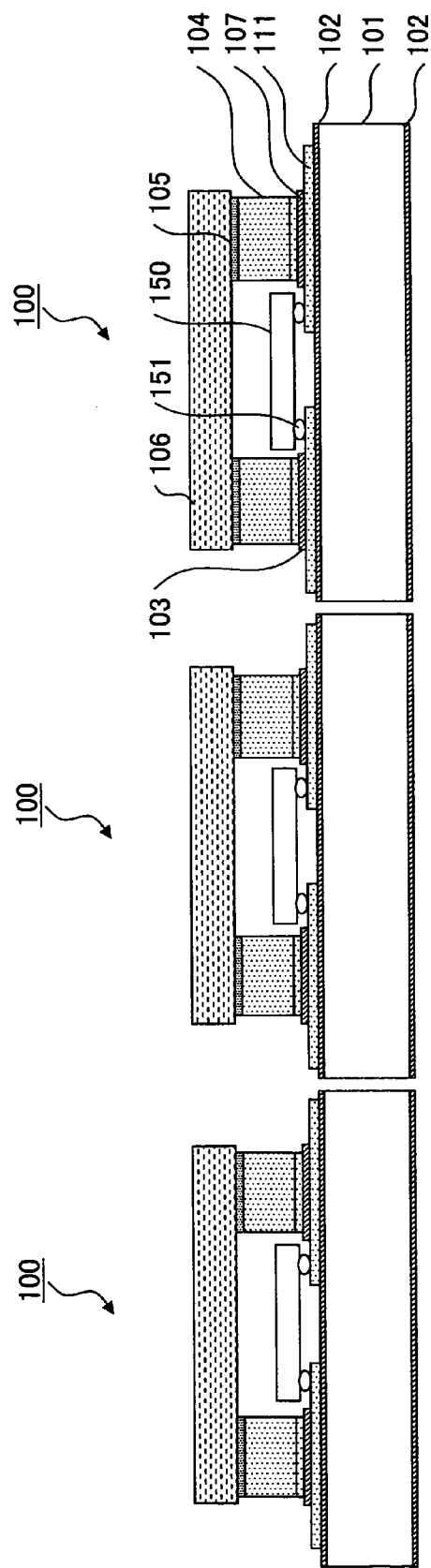

SEMICONDUCTOR DEVICE AND METHOD FOR MANUFACTURING SEMICONDUCTOR DEVICE

BACKGROUND OF THE INVENTION

1. Field of the Invention

The present invention generally relates to a semiconductor device having a structure in which a semiconductor element on a substrate is sealed and a method for manufacturing such a semiconductor device.

2. Description of the Related Art

There are various types of elements formed or mounted on a substrate. In some cases, it is preferable to use elements in a sealed status on the substrate depending on the types of elements.

For example, Micro Electro Mechanical System (also referred to as MEMS) is used for such elements (hereafter referred to as MEMS elements), which are typical elements preferably used in a sealed status on a substrate in terms of structure.

Examples of such MEMS elements include pressure sensors, acceleration sensors, optical functional elements such as digital micromirror devices, and the like. Such MEMS elements are used preferably in a vacuum state or a decompressed state or in an atmosphere replaced with an inert gas and the elements are preferably used in a hermetically sealed status. In view of this, various methods for sealing MEMS elements have been proposed (refer to Patent Documents 1 to 4, for example)

Patent Document 1: Japanese Laid-Open Patent Application No. 8-316496
Patent Document 2: Japanese Laid-Open Patent Application No. 2005-19966
Patent Document 3: Japanese Laid-Open Patent Application No. 2000-141300
Patent Document 4: Japanese Laid-Open Patent Application No. 2002-246489

However, as disclosed in the above-mentioned Patent Documents 1 and 2 (Japanese Laid-Open Patent Application No. 8-316496 and Japanese Laid-Open Patent Application No. 2005-19966) for example, methods including mechanical processing of silicon wafers in which an element is sealed by laminating silicon wafers, for example, are problematic in that the form of silicon wafers for sealing the element becomes complicated and the processing of such silicon wafers requires costs and time.

Further, as disclosed in the above-mentioned Patent Documents 3 and 4 (Japanese Laid-Open Patent Application No. 2000-141300 and Japanese Laid-Open Patent Application No. 2002-246489) for example, when a structure for sealing the element is formed with solder, it poses a problem in that components of flux and the like included in solder are diffused in a sealed space. Also, bonding using such solder includes a reflow step for increasing the temperature of solder, so that a problem such as contamination of flux, for example, in a sealed space is likely to be caused.

SUMMARY OF THE INVENTION

It is a general object of the present invention to provide an improved and useful semiconductor device and a method for manufacturing a semiconductor device in which the above-mentioned problems are eliminated.

A more specific object of the present invention is to provide a semiconductor device having a structure in which an element is sealed on a substrate such that contamination in a sealed space is controlled in a simple structure and to provide a method for manufacturing such a semiconductor device.

According to a first aspect of the present invention, there is provided a semiconductor device including a substrate, an element on the substrate, and a sealing structure for sealing the element. The sealing structure has a structure in which a partition wall made of a metallic material formed on the substrate by a plating method so as to surround the element and a cap portion disposed on the partition wall are bonded via a bonding layer made of an inorganic material, thereby achieving the aforementioned objects.

The semiconductor device is configured such that contamination in a space where the element is sealed is controlled in a simple structure.

If the bonding layer is made of silicon or glass, the bonding to the cap portion can be readily performed.

Preferably, the bonding layer and the cap portion are bonded by anodic bonding so as to control the contamination in the space sealed by the sealing structure.

Preferably, the element is made of a MEMS element so as to hermetically seal the MEMS element effectively in the space where the contamination is controlled.

Preferably, the element is made of an optical functional element so as to hermetically seal the optical functional element in the space where the contamination is controlled.

If wiring to be connected to the element is formed so as to penetrate the substrate, the wiring to be connected to the element can be disposed in a space-saving manner.

If the wiring to be connected to the element is formed between the partition wall and the substrate, the wiring to be connected to the element can be readily formed in a simple method.

If an insulating layer is formed between the wiring and the substrate and between the wiring and the partition wall, the wiring can be insulated.

According to a second aspect of the present invention, there is provided a method for manufacturing a semiconductor device having a structure in which an element on a substrate is sealed by a sealing structure. The method for manufacturing a semiconductor device includes the steps of forming a partition wall made of a metallic material on the substrate by a plating method so as to surround a mounting portion or a forming portion of the element, forming a bonding layer made of an inorganic material on the partition wall, and sealing the element by bonding the cap portion and the bonding layer, thereby achieving the aforementioned objects.

According to the method for manufacturing a semiconductor device, it is possible to manufacture a semiconductor device in which contamination in a space where an element is sealed can be controlled.

If the bonding layer is made of silicon or glass, the bonding to the cap portion can be readily performed.

Preferably, the bonding layer and the cap portion are bonded by anodic bonding so as to control the contamination in the space sealed by the sealing structure.

Preferably, the element is made of a MEMS element so as to hermetically seal the MEMS element effectively in the space where the contamination is controlled.

Preferably, the element is made of an optical functional element so as to hermetically seal the optical functional element in the space where the contamination is controlled.

According to the present invention, it is possible to provide a semiconductor device having a structure in which an element is sealed on a substrate such that contamination in a sealed space is controlled in a simple structure and to provide a method for manufacturing such a semiconductor device.

BRIEF DESCRIPTION OF THE DRAWINGS

FIG. 4I is a diagram (ninth) showing a step for manufacturing the semiconductor device of FIG. 1;

FIG. 4J is a diagram (tenth) showing a step for manufacturing the semiconductor device of FIG. 1;

FIG. 4M is a diagram (thirteenth) showing a step for manufacturing the semiconductor device of FIG. 1; and FIG. 4N is a diagram (fourteenth) showing a step for manufacturing the semiconductor device of FIG. 1.

DESCRIPTION OF THE PREFERRED EMBODIMENTS

In the following, embodiments of the present invention will be described with reference to the accompanying drawings.

EXAMPLE 1

Figure 1:
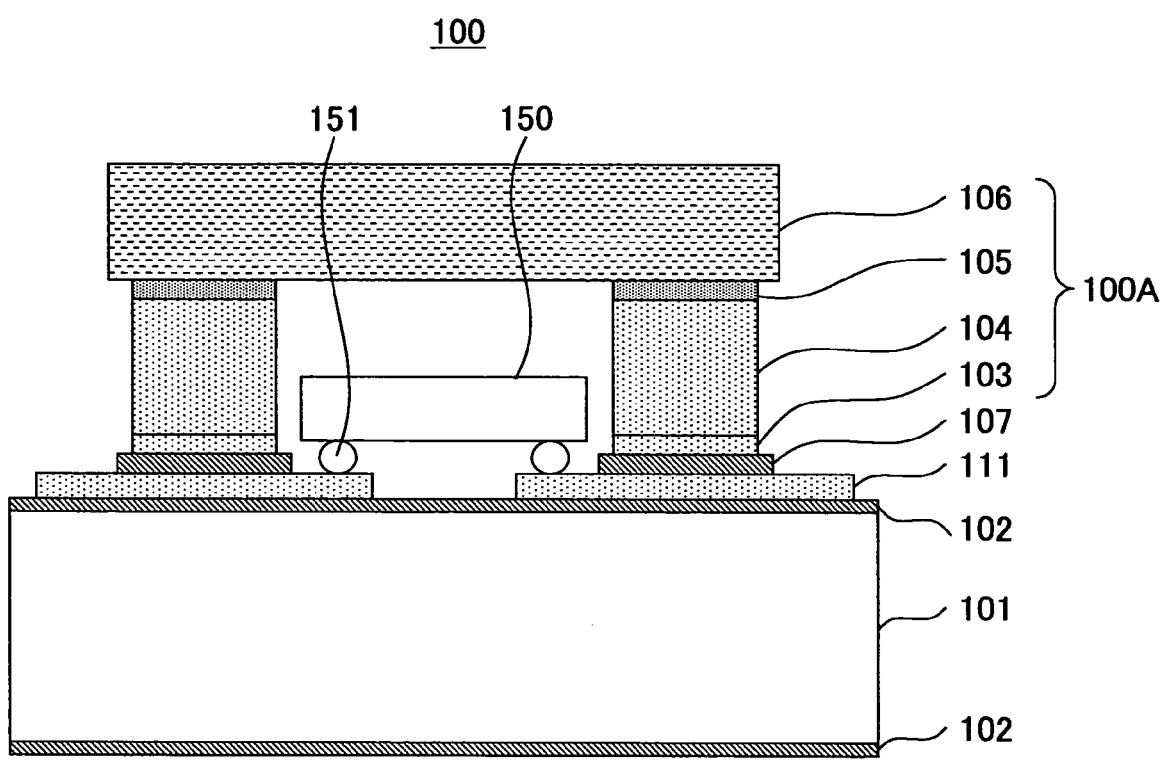
FIG. 1 is a diagram showing a semiconductor device according to example 1.

FIG. 1 is a schematic diagram showing a semiconductor device 100 according to example 1 of the present invention.

With reference to FIG. 1, the semiconductor device 100 according to the present example has a structure in which a semiconductor element 150 on a substrate 101 is hermetically sealed by a sealing structure 100A formed on the substrate 101. A schematic structure of the sealing structure 100A includes a partition wall portion 104 formed on the substrate 101 so as to surround the semiconductor element 150, and a cap portion 106 made of a tabular glass disposed on the partition wall portion 104, thereby hermetically sealing the semiconductor element 150 on the substrate 101.

The partition wall portion 104 is made of a metallic material formed by a plating method and is formed by electrolytic plating using a seed layer 103 as an energizing path, the seed layer 103 being made of a metallic material and being formed on the substrate 101. Further, a bonding layer 105 made of an inorganic material for bonding the partition wall portion 104 and the cap portion 106 is formed between the partition wall portion 104 and the cap portion 106. The bonding layer 105 is made of silicon, for example, and is formed by a sputtering method, for example.

The substrate 101 is made of silicon, for example, and has an insulating layer 102 made of an insulating material such as $SiO_2$ formed on a front surface of the substrate 101 (surface where the semiconductor element 150 is disposed) and a rear surface on the reverse side of the front surface.

A pattern wiring 111 to be connected to the semiconductor element 150 is formed on the insulating layer 102 on the front surface and the pattern wiring 111 is electrically connected to the semiconductor element 150 via a bump 151. An insulating layer 107 made of $SiO_2$, for example, is formed between the pattern wiring 111 and the seed layer 103. In other words, the pattern wiring 111 is insulated from the substrate 101 with the insulating layer 102 and from the partition wall portion 104 (seed layer 103) with the insulating layer 107.

In the aforementioned semiconductor device 100, the partition wall portion 104 is made of a metallic material formed by a plating method and the cap portion 106 is made of an inorganic material such as glass, for example. Further, the partition wall portion 104 and the cap portion 106 are bonded using an inorganic material such as silicon so as to hermetically seal the semiconductor element 150. Thus, the cleanliness of a space where the semiconductor element 150 is sealed (hereafter referred to as a sealed space) is maintained.

For example, if a material for constituting the sealing structure is made of an organic material such as a resin material, a bond made of a resin material, or the like, the airtightness of the sealing structure may not be sufficient due to a high permeability of gas in some cases. Moreover, if the material for constituting the sealing structure is made of a flux material such as solder or the like, the sealed space may be contaminated from the flux material in some cases.

By contrast, the sealing structure 100A according to the present example is formed using an inorganic material and the airtightness of the sealing structure is good due to a low permeability of gas, so that it is possible to effectively isolate and protect the semiconductor element 150 from an external space. Further, none of the materials for constituting the sealing structure 100A are substantially made of materials such as flux, an organic substance, or the like, so that desorption of gas or impurities is small. Thus, it is possible to maintain the cleanliness of the sealed space.

Preferably, the bonding between the bonding layer 105 and the cap portion 106 is performed by anodic bonding. In this case, the reliability of the bonding between the bonding layer 105 and the cap portion 106 is improved by anodic bonding and it is possible to perform the bonding in a clearer manner in comparison with reflow soldering, for example. In this case, the anodic bonding refers to a method including the steps of applying a high voltage between the bonding layer 105 and the cap portion 106 and performing a predetermined heating, thereby performing bonding. A method for forming the sealing structure including the anodic bonding will be described from FIG. 4A.

The material for constituting the cap portion 106 is not limited to glass and other inorganic material such as silicon may be used. In this case, the bonding layer 105 may be formed using glass (borosilicate glass), for example, and the cap portion and the bonding layer may be bonded by anodic bonding.

Further, the bonding layer 105 may be formed using silicon or glass and the cap portion 106 may be formed using a metallic or ceramic material. In this case, a bonding layer made of silicon or glass is formed on the partition wall portion 104 by sputtering, a thin film (bonding layer) made of glass or silicon is formed on a front surface (bonding surface) of the metallic or ceramic material for the cap portion 106 by sputtering, and both elements are bonded. In this case, if the bonding layer formed on the partition wall portion 104 is made of silicon, the bonding layer made of glass may be formed on the cap portion side. By contrast, if the bonding layer formed on the partition wall portion 104 is made of glass, the bonding layer made of silicon may be formed on the cap portion side.

The semiconductor device according to the present example is capable of readily allowing the forming of the sealing structure 100A and the manufacturing cost of the semiconductor device is reduced.

For example, upon forming a structure corresponding to the sealing structure 100A according to the present example, one method includes the steps of processing silicon (silicon wafer) and laminating the resultant silicon, thereby forming a sealing structure. However, in this case, the form of silicon for sealing an element becomes complicated and poses a problem in that the processing of silicon requires costs and time. If the same structure is manufactured using glass, it also poses a problem in that the processing thereof becomes complicated in the same manner.

Further, if the partition wall is formed using an Au—Sn ribbon material, for example, it poses a problem in that the manufacturing cost of the sealing structure is increased since such a ribbon material is expensive.

By contrast, in the sealing structure 100A according to the present example, the partition wall portion 104 as a main portion of the structure for sealing between the cap portion 106 and the substrate 101 is formed by a plating method. Thus, it is possible to readily form the partition wall portion 104 at a low cost. Also, it is possible to select various metallic materials depending on necessity from various metallic materials capable of being formed by a plating method, so that a low-cost metallic material can be selected.

For example, if the pattern wiring 111 is formed by Cu plating, preferably, the partition wall portion 104 is formed by the same Cu plating as in the pattern wiring 111 so as to share equipment and materials for plating. Further, the forming of the partition wall portion 104 is not limited to the use of Cu. For example, the partition wall portion 104 may be formed using Ni, Cr, Ti, Au, Co, an alloy material in which these metallic materials are combined, an alloy material made of any one of these metallic materials, or the like.

Further, although the seed layer 103 can be formed using the same material as in the aforementioned partition wall portion 104, the seed layer 103 may be formed by electroless plating, a sputtering method, CVD method, or the like, for example.

In the aforementioned sealing structure 100A, the structure of the cap portion 106 disposed on the partition wall portion 104 is a simple tabular form, so that processing thereof can be readily performed. For example, processing for forming a concave portion on an inorganic material such as silicon and glass is problematic in that it requires costs and time. However, the manufacturing of the sealing structure according to the present example is easy through a combination of the partition wall formed by a plating method and the tabular glass.

In the semiconductor device 100 according to the present example, it is possible to constitute the pattern wiring 111 connected to the semiconductor element 150 in various forms, so that the degree of freedom in the design of a wiring pattern is increased. For example, if the sealing structure is formed using silicon or glass in an integrated manner, in other words, when the cap portion and the partition wall are formed in an integrated manner, an interface for anodic bonding is disposed between the sealing structure and the substrate.

In this case, it is difficult to seal a step-like shape by anodic bonding, so that it is difficult to insert the pattern wiring on the interface. Thus, there is a problem in that it is difficult to form wiring extending from a sealed semiconductor element to the outside of the sealed space along the substrate.

By contrast, in the present example, the partition wall portion 104 is formed by a plating method, so that it is possible to form the partition wall portion 104 on the pattern wiring 111 formed on the substrate 101 and to seal the semiconductor element 150. In other words, it is possible to form the pattern wiring 111 between the partition wall portion 104 (seed layer 103) and the substrate 101 (insulating layer 102). Thus, it is possible to readily form the wiring from the space where the semiconductor element 150 is sealed to the outside of the space.

In this case, the insulating layer 107 is preferably formed between the pattern wiring 111 and the partition wall portion 104 (seed layer 103). In the present example, the insulating layer 102 is also formed between the pattern wiring 111 and the substrate 101 and insulation of the pattern wiring 111 is ensured.

The semiconductor element 150 sealed by the sealing structure 100A is made of what is called a MEMS element, for example. Examples of such MEMS element include pressure sensors, acceleration sensors, optical functional elements such as digital micromirror devices and optical switches, and the like. The MEMS element is used preferably in a vacuum state or a decompressed state or in an atmosphere replaced with an inert gas and preferably the element is used in a hermetically sealed status.

The semiconductor element 150 may be made of a conventional semiconductor element other than a MEMS element. For example, the semiconductor element 150 may be made of a conventional optical functional element without a mechanical driving unit. Examples of such an optical functional element include photoelectric conversion elements (such as PD and CMOS), light-emitting elements (such as LED), and the like. The aforementioned optical functional element receives light or emits light, so that preferably the optical functional element is hermetically sealed and protected by the sealing structure so as to prevent adhesion of dust or dirt which blocks light. If the semiconductor element 150 is made of an optical functional element, the cap portion 106 may include what is called a filter function having the properties of allowing the transmission of a light with a predetermined wavelength.

Further, the semiconductor element 150 may be made of an element directly formed on the substrate 101 or may be formed using other semiconductor substrate and disposed on the substrate 101.

Moreover, the substrate 101 is not limited to a silicon substrate (silicon wafer) but may be made of a compound semiconductor substrate made of GaAs and the like or a substrate made of a ceramic material and the like, for example.

EXAMPLE 2

The form of wiring connected to the semiconductor element 150 is not limited to the form described in example 1 but may be created in various patterns.

Figure 2:
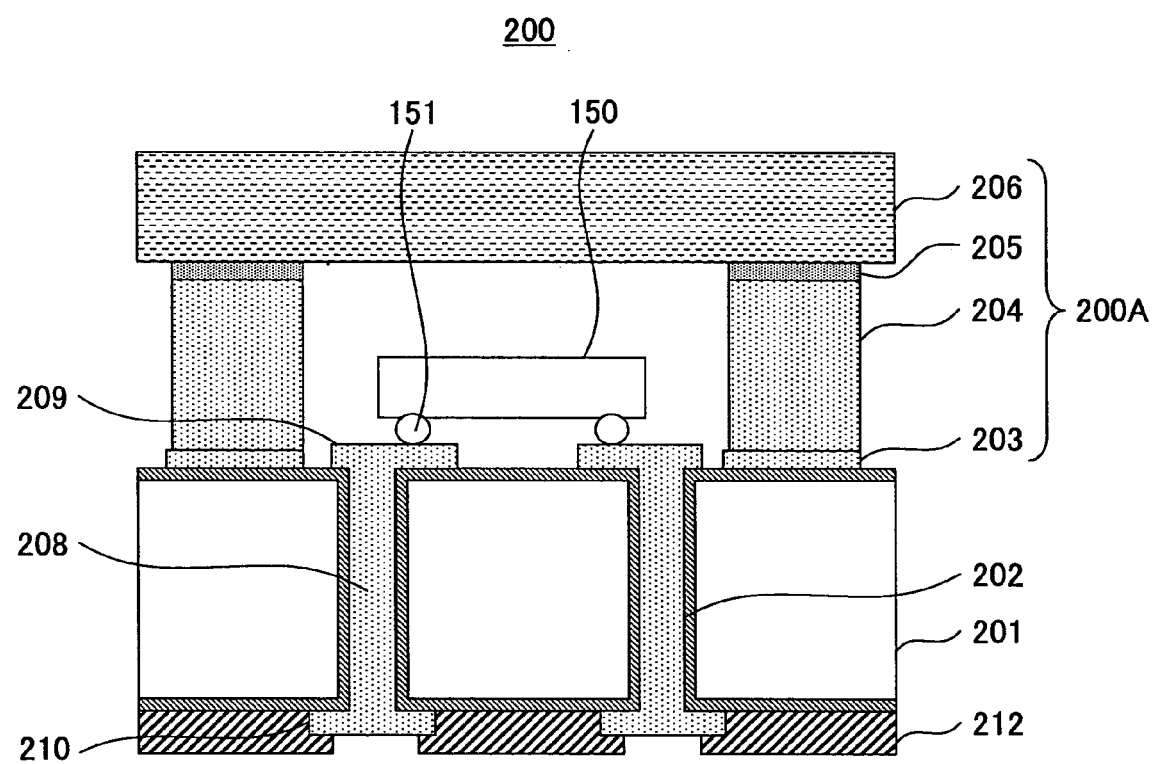
FIG. 2 is a diagram showing a semiconductor device according to example 2.

FIG. 2 is a schematic diagram showing a semiconductor device 200 according to example 2 of the present invention, where the same reference numerals are given to the aforementioned portions and description thereof is omitted.

With reference to FIG. 2, the semiconductor device 200 according to the present example has a structure in which a sealing structure 200A corresponding to the sealing structure 100A is formed on a substrate 201 corresponding to the substrate 101 and the semiconductor element 150 is hermetically sealed.

The sealing structure 200A includes a seed layer 203, a partition wall portion 204, a bonding layer 205, and a cap portion 206, corresponding to the seed layer 103, the partition wall portion 104, the bonding layer 105, and the cap portion 106, respectively. The sealing structure 200A is constituted using the same materials in the same manner as in example 1 and the same effects as in example 1 are provided.

In the semiconductor device 200 according to the present example, as will be described in the following, the structure of the wiring connected to the semiconductor element 150 is different from the case of example 1. A via plug 208 for penetrating the substrate 201 is formed on the substrate 201. A pattern wiring 209 to be connected to the semiconductor element 150 via the bump 151 is formed on one end of the via plug 208 and a pattern wiring 210 is formed on the other end on the reverse side of the via plug 208.

An insulating layer 202 corresponding to the insulating layer 102 is formed on a surface of the substrate 201. Portions such as the seed layer 203, the via plug 208, the pattern wirings 209 and 210 made of a metallic material are insulated from the substrate 101 using the insulating layer 202.

Further, a surface on the reverse side of a surface where the semiconductor element 150 is mounted is covered with a solder mask layer 212, for example, and an opening for exposing the pattern wiring 210 is formed on the solder mask layer 212.

In the semiconductor device 200, the via plug 208 is formed so as to penetrate the substrate 201 and a connection portion (pattern wiring 210) for connecting to the semiconductor element 150 is formed on the reverse side of the substrate 201. Thus, it is possible to form a wiring structure for connecting to the semiconductor element in a space-saving manner and to miniaturize the semiconductor device 200.

EXAMPLE 3

Figure 3:
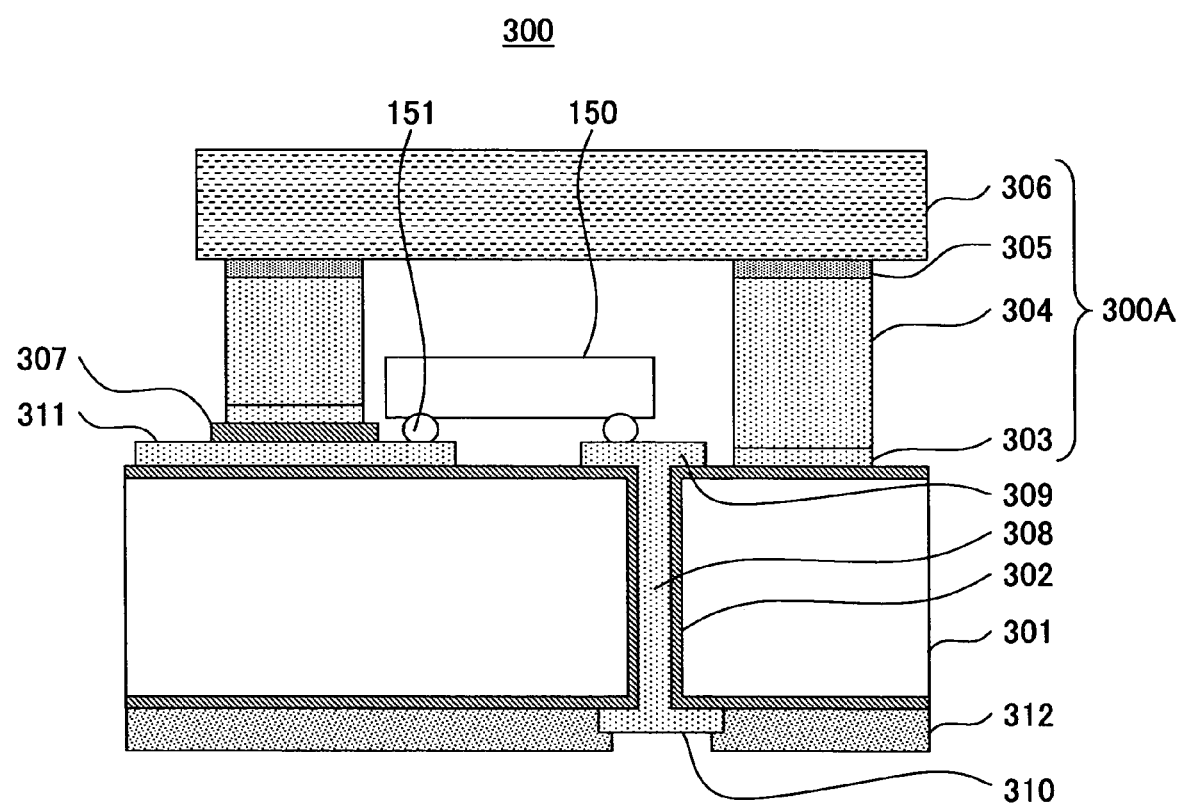
FIG. 3 is a diagram showing a semiconductor device according to example 3.

FIG. 3 is a schematic diagram showing a semiconductor device 300 according to example 3 of the present invention, where the same reference numerals are given to the aforementioned portions and description thereof is omitted.

With reference to FIG. 3, the semiconductor device 300 according to the present example has a structure in which a sealing structure 300A corresponding to the sealing structure 100A is formed on a substrate 301 corresponding to the substrate 101 and the semiconductor element 150 is hermetically sealed.

The sealing structure 300A includes a seed layer 303, a partition wall portion 304, a bonding layer 305, and a cap portion 306, corresponding to the seed layer 103, the partition wall portion 104, the bonding layer 105, and the cap portion 106, respectively. The sealing structure 300A is constituted using the same materials in the same manner as in example 1 and the same effects as in example 1 are provided.

In the semiconductor device 300 according to the present example, as will be described in the following, both the wiring structure described in example 1 and the wiring structure described in example 2 are formed. For example, a pattern wiring 311 and an insulating layer 307 corresponding to the pattern wiring 111 and the insulating layer 107 in example 1, respectively, are formed on an insulating layer 302 formed on the substrate 301.

Further, a via plug 308 and pattern wirings 309 and 310 corresponding to the via plug 208 and the pattern wirings 209 and 210 in example 2, respectively, are formed on the substrate 301. Also, a solder mask layer 312 for covering the rear surface of the substrate 301, corresponding to the solder mask layer 212, is formed.

In this manner, the wiring structure (the pattern wiring, the via plug, and the like) connected to the semiconductor element 150 may be formed through variations and modifications where appropriate.

EXAMPLE 4

Figure 4A:
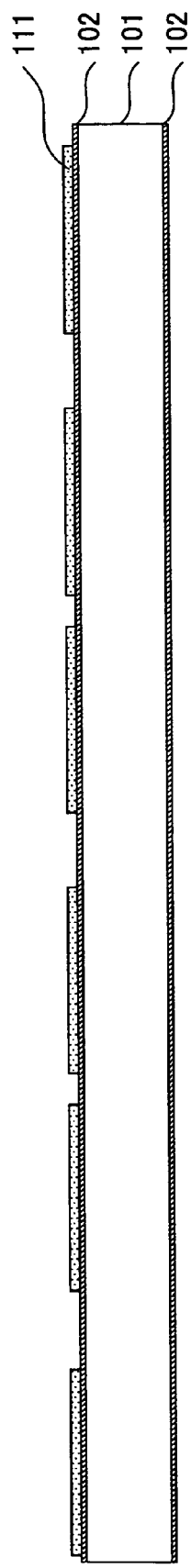
FIG. 4A is a diagram (first) showing a step for manufacturing the semiconductor device of FIG. 1.

Next, an example of a method for manufacturing the semiconductor device 100 in example 1 is described in accordance with a procedure based on FIG. 4A to FIG. 4N. In addition, the same reference numerals are given to the portions mentioned in FIG. 1.

First, in steps shown in FIG. 4A, the insulating layer 102 made of an inorganic material such as $SiO_2$ or an organic material such as epoxy or polyimide, for example, is formed on the front surface (where a semiconductor chip is mounted) and the rear surface of the substrate 101 made of silicon. Next, the pattern wiring 111 connected to the semiconductor element is formed on the insulating layer 102 on the front side using patterning by a plating method, for example.

Figure 4B:
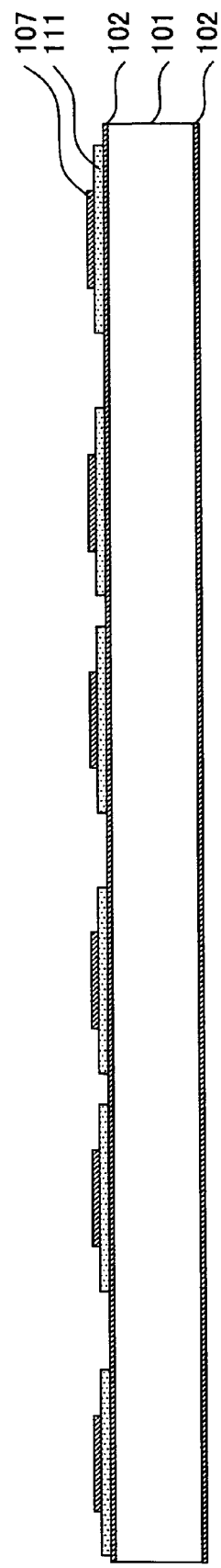
FIG. 4B is a diagram (second) showing a step for manufacturing the semiconductor device of FIG. 1.

Next, in a step shown in FIG. 4B, the insulating layer 107 made of an inorganic material such as $SiO_2$ or an organic material such as epoxy or polyimide, for example, is formed on the pattern wiring 111 using patterning.

Figure 4C:
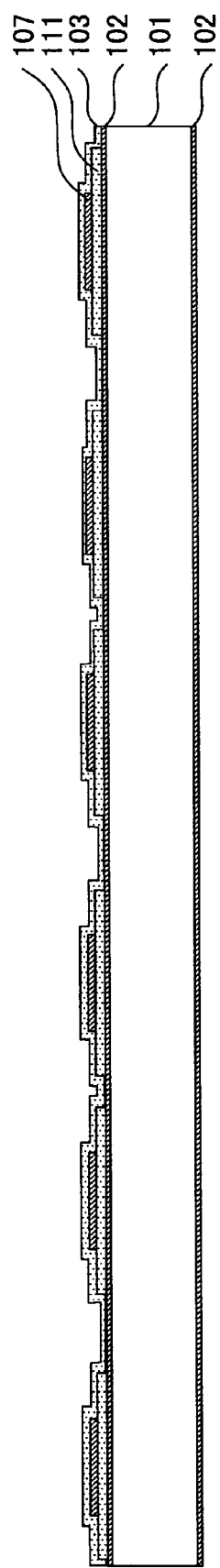
FIG. 4C is a diagram (third) showing a step for manufacturing the semiconductor device of FIG. 1.

Next, in a step shown in FIG. 4C, the seed layer 103 made of Cu, for example, is formed by electroless plating, for example. The method for forming the seed layer 103 is not limited to the electroless plating but may use a sputtering method, CVD method, or the like, for example.

Figure 4D:
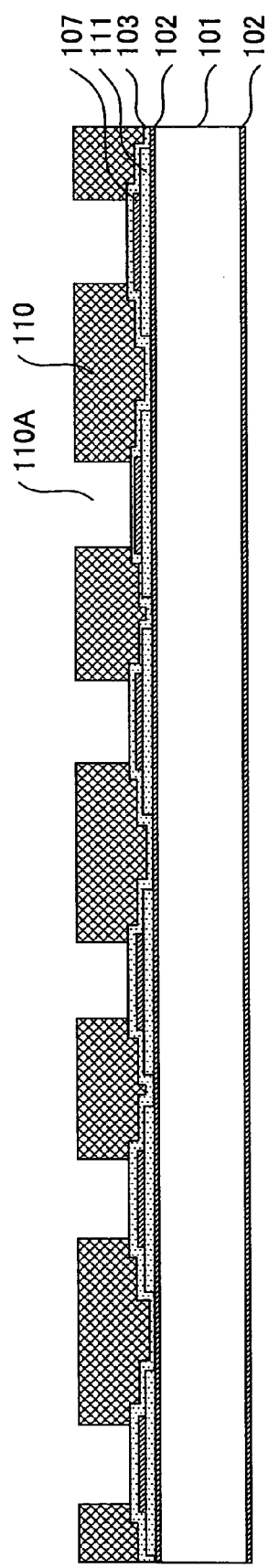
FIG. 4D is a diagram (fourth) showing a step for manufacturing the semiconductor device of FIG. 1.

Next, in a step shown in FIG. 4D, dry film resist, for example, formed so as to cover the seed layer 103 or a coated resist film is patterned and a resist pattern 110 having an opening 110A is formed.

Figure 4E:
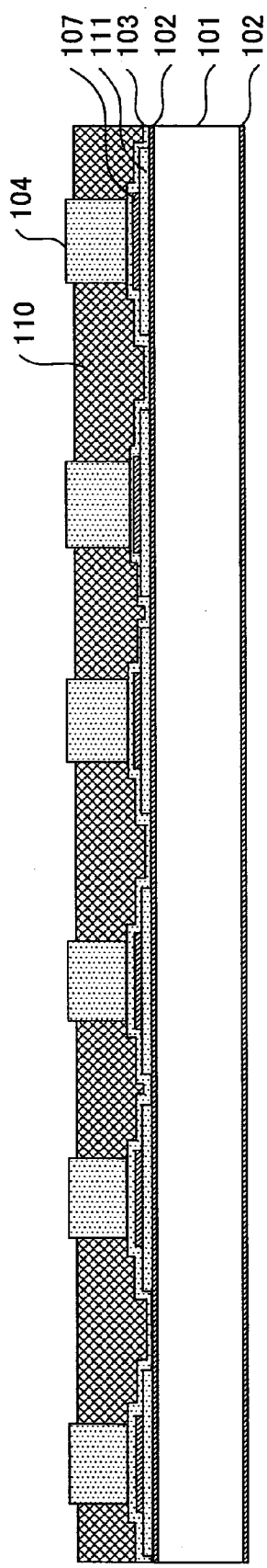
FIG. 4E is a diagram (fifth) showing a step for manufacturing the semiconductor device of FIG. 1.

Next, in a step shown in FIG. 4E, the partition wall portion 104 made of Cu is formed at the opening 110A by electrolytic plating, for example. In this case, a height of the partition wall portion 104 is formed to be slightly higher than that of the resist pattern 110.

Figure 4F:
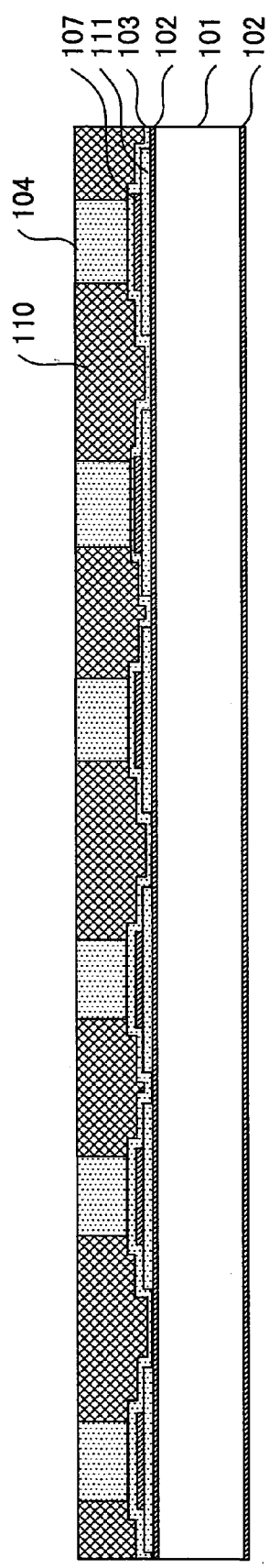
FIG. 4F is a diagram (sixth) showing a step for manufacturing the semiconductor device of FIG. 1.

Next, in a step shown in FIG. 4F, the partition wall portion 104 is polished by CMP (Chemical Mechanical Polishing) and the height of the resist pattern 110 and that of the partition wall portion 104 are made to be substantially the same. And an upper surface of the partition wall portion 104 is made flat.

Figure 4G:
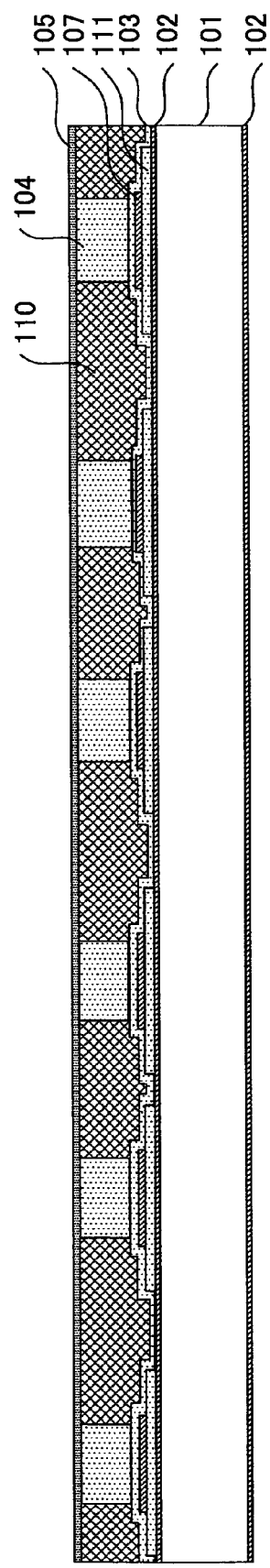
FIG. 4G is a diagram (seventh) showing a step for manufacturing the semiconductor device of FIG. 1.

Next, in a step shown in FIG. 4G, the bonding layer 105 made of silicon is formed on the resist pattern 110 and the partition wall portion 104 exposed from the resist pattern 110 by a sputtering method, for example.

Figure 4H:
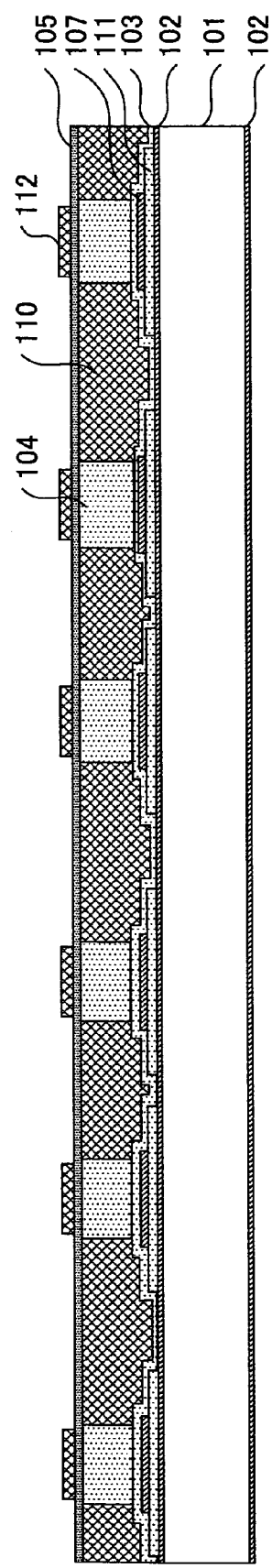
FIG. 4H is a diagram (eighth) showing a step for manufacturing the semiconductor device of FIG. 1.

Next, in a step shown in FIG. 4H, in the same manner as shown in FIG. 4D, dry film resist or a coated resist film, for example, is patterned and a resist pattern 112 is formed so as to selectively cover the bonding layer 105 formed on the partition wall portion 104.

Next, in a step shown in FIG. 4I, a portion of the bonding layer 105 which is not covered with the resist pattern 112 is etched and the bonding layer 105 is patterned.

Next, in a step shown in FIG. 4J, the resist pattern 110 is removed (separated) and the seed layer 103 exposed by removing the resist pattern 110 is removed by etching.

Figure 4K:
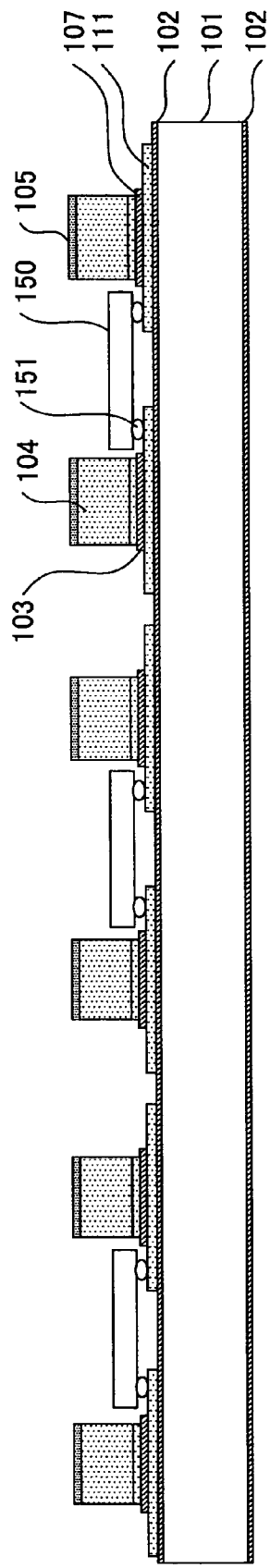
FIG. 4K is a diagram (eleventh) showing a step for manufacturing the semiconductor device of FIG. 1.

Next, in a step shown in FIG. 4K, the semiconductor element 150 made of a MEMS element, for example, is disposed such that it is connected to the pattern wiring 111 via the bump 151.

In addition, the semiconductor element may be directly formed on the substrate 101. In this case, the substrate 101 is made of a semiconductor substrate such as silicon or a compound semiconductor. And the semiconductor element 150 is formed on the substrate 101 in the steps shown in FIG. 4A or a prior step. Other step may be the same as in the step of FIG. 4K in which the semiconductor element 150 is disposed.

Figure 4L:
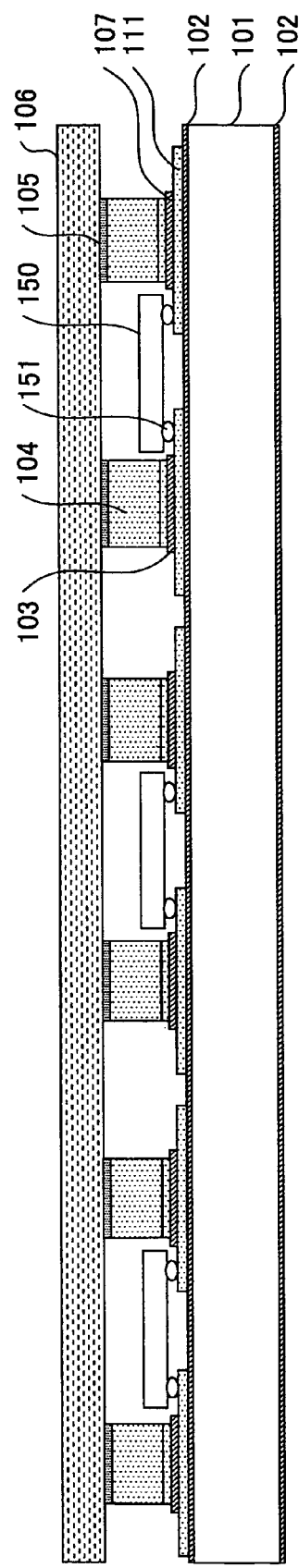
FIG. 4L is a diagram (twelfth) showing a step for manufacturing the semiconductor device of FIG. 1.

Next, in a step shown in FIG. 4L, the cap portion 106 made of tabular glass is disposed on the bonding layer 105 and bonded by anodic bonding, thereby forming a structure for hermetically sealing the semiconductor element 150. In this case, the anodic bonding is performed by applying a high voltage between the cap portion 106 and the bonding layer 105 and raising the temperature between the cap portion 106 and the bonding layer 105 up to about 300 to 350° C., for example. In this case, the cap portion 106 is assumed to be the cathode and the bonding layer 105 is assumed to be the anode. In addition, the glass constituting the cap portion 106 is preferably made of borosilicate glass so as to facilitate the anodic bonding.

When the above-mentioned anodic bonding is performed, silicon in the bonding layer and oxygen in the cap portion are bonded with a good bonding strength in a stable manner. Further, gas, impurities, and the like resulting in contamination of a sealed space are hardly generated in contrast to reflow soldering.

Next, in a step shown in FIG. 4M, the cap portion 106 is divided by dicing. And in a step shown in FIG. 4N, the substrate 101 is divided by dicing, thereby obtaining individual pieces of the semiconductor device 100.

According to the above-mentioned method, it is possible to manufacture the semiconductor device 100 described in example 1. In the aforementioned manufacturing steps, the effects of contamination in the sealed space where the semiconductor element is sealed are controlled by the sealing structure and the cleanliness of the sealed space is maintained.

Further, since the sealing structure includes a combination of the tabular cap portion having a simple structure and the partition wall formed by a plating method, the manufacturing of the sealing structure is easy and the manufacturing cost thereof is reduced.

According to the present invention, it is possible to provide a semiconductor device having a structure in which an element is sealed on a substrate such that contamination in a sealed space is controlled in a simple structure and to provide a method for manufacturing such a semiconductor device.

The present invention is not limited to the specifically disclosed embodiment, and variations and modifications may be made without departing from the scope of the present invention.

The present application is based on Japanese priority application No. 2005-204795 filed Jul. 13, 2005, the entire contents of which are hereby incorporated herein by reference.

What is claimed is:

1. A semiconductor device comprising:
    a substrate;
    an element on the substrate; and
    a sealing structure configured to seal the element, wherein
    the sealing structure includes a partition wall entirety made of a plated metallic material and a cap portion disposed on the partition wall, the cap portion being bonded via a bonding layer made of an inorganic material, the partition wall being formed on a seed layer formed on the substrate so as to surround the element,
    wherein wiring connected to the element is formed between the partition wall and the substrate, and an insulating layer is formed between the wiring and the substrate and between the wiring and the partition wall.

2. The semiconductor device according to claim 1, wherein the bonding layer is made of silicon or glass.

3. The semiconductor device according to claim 2, wherein the bonding layer and the cap portion are bonded by anodic bonding.

4. The semiconductor device according to claim 1, wherein the element is made of a Micro Electro Mechanical System element.

5. The semiconductor device according to claim 1, wherein the element is made of an optical functional element.

6. The semiconductor device according to claim 1, wherein wiring connected to the element is formed so as to penetrate the substrate.

* * * * *